US010526728B2

(12) United States Patent
Kudo et al.

(10) Patent No.: US 10,526,728 B2
(45) Date of Patent: Jan. 7, 2020

(54) SILICON WAFER AND METHOD FOR MANUFACTURING SAME

(71) Applicant: SUMCO CORPORATION, Tokyo (JP)

(72) Inventors: Satoshi Kudo, Tokyo (JP); Kouzou Nakamura, Tokyo (JP); Toshiyuki Muranaka, Tokyo (JP); Shuhei Matsuda, Tokyo (JP); Tegi Kim, Tokyo (JP); Keiichiro Hiraki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/306,860

(22) PCT Filed: Apr. 10, 2015

(86) PCT No.: PCT/JP2015/002025
§ 371 (c)(1),
(2) Date: Oct. 26, 2016

(87) PCT Pub. No.: WO2015/186288
PCT Pub. Date: Dec. 10, 2015

(65) Prior Publication Data
US 2017/0044688 A1     Feb. 16, 2017

(30) Foreign Application Priority Data
Jun. 2, 2014 (JP) ................. 2014-114335

(51) Int. Cl.
*C30B 33/02* (2006.01)
*H01L 21/324* (2006.01)
(Continued)

(52) U.S. Cl.
CPC .............. *C30B 33/02* (2013.01); *C30B 29/06* (2013.01); *H01L 21/221* (2013.01);
(Continued)

(58) Field of Classification Search
CPC ....... C30B 33/02; C30B 29/06; H01L 21/324; H01L 21/221
See application file for complete search history.

(56) References Cited

U.S. PATENT DOCUMENTS 4,579,601 A * 4/1986 Samata ................. H01L 21/322
257/E21.317
5,534,294 A * 7/1996 Kubota ................... C30B 15/00
257/E21.318
(Continued)

FOREIGN PATENT DOCUMENTS

JP    H09-205048 A    8/1997
JP    2002-104897 A   4/2002
(Continued)

OTHER PUBLICATIONS

International Search Report issued in Patent Application No. PCT/JP2015/002025, dated Jul. 14, 2015, along with English translation thereof.

*Primary Examiner* — Nahida Sultana
(74) *Attorney, Agent, or Firm* — Greenblum & Bernstein, P.L.C.

(57) ABSTRACT

A manufacturing method of this invention includes: a step of slicing a silicon single crystal containing boron as an acceptor and obtaining a non-heat-treated silicon wafer, a step of determining a boron concentration with respect to the non-heat-treated silicon wafer, and a step of determining an oxygen donor concentration with respect to the non-heat-treated silicon wafer, in which a determination as to whether or not to perform a heat treatment at a temperature of 300° C. or more on the non-heat-treated silicon wafer is made based on a boron concentration determined in the step of determining a boron concentration, and an oxygen donor concentration determined in the step of determining an oxygen donor concentration. By this means, a wafer in (Continued)

which unevenly distributed LPDs that are present on the wafer are reduced is obtained.

14 Claims, 2 Drawing Sheets

(51) Int. Cl.
    *H01L 21/22*     (2006.01)
    *C30B 29/06*     (2006.01)
    *H01L 21/322*     (2006.01)
    *H01L 29/34*     (2006.01)

(52) U.S. Cl.
    CPC ........ *H01L 21/324* (2013.01); *H01L 21/3221* (2013.01); *H01L 21/3225* (2013.01); *H01L 29/34* (2013.01)

(56) References Cited

U.S. PATENT DOCUMENTS

| | | | |
|---|---|---|---|
| 5,629,216 A * | 5/1997 | Wijaranakula | C30B 15/206 117/13 |
| 6,548,886 B1 * | 4/2003 | Ikari | C30B 15/203 117/13 |
| 6,663,708 B1 * | 12/2003 | Morita | C30B 29/06 117/11 |
| 7,141,113 B1 * | 11/2006 | Nakamura | C30B 15/14 117/3 |
| 8,231,852 B2 | 7/2012 | Itou et al. | |
| 9,337,013 B2 | 5/2016 | Fusegawa et al. | |
| 9,673,052 B2 * | 6/2017 | Shikauchi | C30B 29/06 |
| 2004/0048456 A1 * | 3/2004 | Sato | H01L 21/324 438/542 |
| 2006/0263967 A1 * | 11/2006 | Falster | C30B 29/06 438/226 |
| 2009/0218661 A1 * | 9/2009 | Kurita | C30B 15/00 257/629 |
| 2010/0038755 A1 * | 2/2010 | Park | H01L 21/3225 257/617 |
| 2010/0163807 A1 * | 7/2010 | Fukuda | C30B 15/00 252/500 |
| 2010/0224968 A1 * | 9/2010 | Kurita | C30B 15/00 257/655 |
| 2010/0290971 A1 | 11/2010 | Itou et al. | |
| 2012/0012983 A1 * | 1/2012 | Ono | C30B 29/06 257/607 |
| 2012/0315739 A1 * | 12/2012 | Hashii | B24B 9/065 438/460 |
| 2013/0102129 A1 * | 4/2013 | Falster | H01L 31/1804 438/471 |
| 2013/0109180 A1 * | 5/2013 | Tanimoto | B24B 37/042 438/692 |
| 2013/0112260 A1 * | 5/2013 | Bazer-Bachi | H01L 21/2255 136/256 |
| 2014/0070369 A1 * | 3/2014 | Kitamura | H01L 21/22 257/607 |
| 2014/0103492 A1 | 4/2014 | Fusegawa et al. | |
| 2014/0125374 A1 * | 5/2014 | Ham | H01L 22/12 324/762.05 |
| 2014/0256078 A1 * | 9/2014 | Jin | B81C 1/00515 438/57 |
| 2015/0001680 A1 * | 1/2015 | Oka | H01L 21/3225 257/617 |
| 2015/0284875 A1 * | 10/2015 | Veirman | C30B 29/06 125/30.01 |
| 2016/0322233 A1 * | 11/2016 | Nakayama | C30B 29/06 |
| 2017/0011918 A1 * | 1/2017 | Torigoe | C23C 16/24 |
| 2017/0236711 A1 * | 8/2017 | Shikauchi | C30B 29/06 438/478 |

FOREIGN PATENT DOCUMENTS

| | | |
|---|---|---|
| JP | 2010-267846 A | 11/2010 |
| JP | 2011-042536 A | 3/2011 |
| JP | 2001-261493 A | 9/2011 |
| JP | 2013-004825 A | 1/2013 |
| JP | 2013-119486 A | 6/2013 |

\* cited by examiner

SILICON WAFER AND METHOD FOR MANUFACTURING SAME

TECHNICAL FIELD

The present invention relates to a silicon wafer in which LPDs are reduced and which can be favorably used for a substrate of a semiconductor device or the like, and to a method for manufacturing the silicon wafer.

BACKGROUND ART

A semiconductor substrate used for a semiconductor device is manufactured from a silicon wafer that is cut from a silicon single crystal ingot. A silicon single crystal for this purpose is normally manufactured by the Czochralski method (hereunder, referred to as "CZ method"). In the CZ method, a crystal raw material is melted inside a crucible provided at a lower part within a chamber, a seed crystal is brought into contact with the surface of the obtained melt, and the seed crystal is lifted upwards while rotating the seed crystal (and the crucible) around its own axis to thereby grow a single crystal below the seed crystal.

A single crystal obtained by the CZ method includes a conical shoulder portion that is a portion whose diameter gradually increases from the diameter of the seed crystal, a cylindrical body portion located below the shoulder portion, and an inverted cone-shaped tail portion located below the body portion. The body portion is finished to have a diameter of a predetermined dimension by cylindrical grinding using a cylindrical grinder, and thereafter the shoulder portion and the tail portion are removed from the single crystal. The body portion is then sliced to obtain silicon wafers, and processes such as lapping, chamfering, etching, and grinding are performed on the silicon wafers to obtain silicon wafers to be used for semiconductor substrates.

Various inspections are performed on such silicon wafers. For example, a method that utilizes the reflection of a laser beam on a wafer surface is used to check for defects that appear as concavities and convexities on the surface of a silicon wafer. When a laser beam having a wavelength in the visible to ultraviolet region is irradiated, these detects (LPDs: light point defects) are observed as light points. That is, a defect that is detectable as an LPD is a defect that is present on the surface of a wafer, FIG. 1 illustrates one example of the distribution of LPDs that are observed as light points on a silicon wafer. This kind of LPD distribution can be obtained by detecting, across the entire surface of a wafer, reflected light (including scattered light) of a laser beam at each part of the wafer. For example, reflected light of a laser beam can be detected across the entire surface of a wafer by irradiating a spot-shaped laser beam onto the surface of the wafer while rotating the wafer in-plane around the center thereof, and moving an irradiation portion in the radial direction of the water. The presence/absence as well as size of LPDs can be determined based on the intensity distribution of the reflected light that is detected. By this method, with respect to the size of the LPDs, for example, LPDs to a minimum size of around 26 nm can be detected. Since it is not necessary to perform a special pretreatment on the wafer prior to observation of LPDs, according to this method defects that appear as convexities and concavities on the surface of a wafer can be easily observed.

When LPDs are Observed using a scanning electron microscope (SEM) it is found that some LPDs are protrusions from the wafer surface and some LPDs are concavities formed in the wafer surface. FIG. 2 is an SEM image of an LPD in the form of a protrusion, and FIG. 3 is an SEM image of an LPD in the form of a concavity.

Various factors cause LPDs to arise. For example, some LPDs are caused by machining (see Patent Literature 1), and some LPDs are related to defects introduced during crystal growth (grown-in defects) (see Patent Literature 2).

In Patent Literature 3 a method for manufacturing a silicon wafer is disclosed that includes a heat treatment process in which a silicon wafer that is sliced from a defect-free silicon single crystal and subjected to mirror polishing is heat-treated for a time period of four hours or more and six hours or less at a temperature of 500° C. or more and 600° C. or less, and a re-polishing process in which the silicon wafer that underwent the heat treatment process is re-polished so that the polish amount is 1.5 μm or more. According to Patent Literature 3, it is described that, by this method, LPDs are reduced to the utmost limit and silicon waters for which the rejection rate is low in an inspection process and at the shipment stage can be manufactured with a favorable yield.

CITATION LIST

Patent Literature

Patent Literature 1: Japanese Patent Application Publication No. 2011-42536
Patent Literature 2: Japanese Patent Application Publication No. 2001-261493
Patent Literature 3: Japanese Patent Application Publication No. 2013-4825
Patent Literature 4: Japanese Patent Application Publication No. 2010-267846

SUMMARY OF INVENTION

Technical Problem

The inventors discovered a new type of LPD which has not been reported heretofore. Specifically, the LPDs that the inventors discovered are closely related to a boron concentration and an oxygen donor concentration in a silicon water, and are distributed unevenly on a wafer. Hereunder, these LPDs are referred to as "unevenly distributed LPDs". Since the density of the unevenly distributed LPDs is extremely low in comparison to the density of LPDs reported up to now, at the present time it is considered that the unevenly distributed LPDs do not affect the characteristics of devices that are manufactured using the silicon wafers. However, there is the possibility that in the future the unevenly distributed LPDs may be the cause of problems, such as in the case that microfabrication of wiring patterns of semiconductor device progresses.

Therefore, an object of the present invention is to provide a method for manufacturing a silicon wafer that can eliminate or reduce the unevenly distributed LPDs, and a silicon wafer in which the unevenly distributed LPDs have been eliminated or reduced.

Another object of the present invention is to provide a method for manufacturing a silicon wafer that can prevent or suppress the occurrence of the unevenly distributed LPDs, and a silicon wafer in which the occurrence of the unevenly distributed LPDs has been prevented or suppressed.

Solution to Problem

The inventors Observed on the surface of wafers which had undergone processing steps equivalent to those of a finished product and obtained data regarding the distribution of the LPDs, and when the observation data for at least 25 wafers was added together, it was found that unique LPDs (unevenly distributed LPDs) that are unevenly distributed in a circular shape or a ring (region between two concentric circles) shape were present on the wafers. Therefore, the inventors investigated the conditions under which such unevenly distributed LPDs arise.

As a result, the inventors found that a large number of unevenly distributed LPDs appear on a wafer in which a boron (B) concentration and an oxygen (O) donor concentration are approximately the same and in which these concentrations are within a specific range. In other words, the unevenly distributed LPDs are a unique phenomenon which appears in a case in which a boron concentration and an oxygen donor concentration are approximately the same, and which is not the case where there is a concentration difference of a certain extent between the boron concentration and the oxygen donor concentration.

Further, the inventors discovered that a large amount of unevenly distributed LPDs appear on wafers cut from a silicon single crystal ingot after 50 days have passed from a time that ingot growth is completed. In other words, the unevenly distributed LPDs do not arise in a case where a time period from completion of growth of the silicon single crystal ingot until cutting of the wafer from the ingot is short to a certain extent.

Further, when portions in which the unevenly distributed LPDs were observed of wafers were subjected to elementary analysis, nickel (Ni) was detected in the unevenly distributed LPDs forming protrusions from the wafer surface (see FIG. 2), and copper (Cu) was detected in the unevenly distributed LPDs forming concavities in the wafer surface (see FIG. 3). Analysis of the nickel and copper was performed using the Auger electron spectroscopy.

Based on the above results, it is considered that the unevenly distributed LPDs are formed, with a contribution factor being that nickel or copper is trapped in p/n-type inversion (mixture) regions in which a boron concentration and an oxygen donor concentration are within specific ranges with the passage of time after crystal growth completion, the p/n-type inversion region being a region in which a boron concentration and an oxygen donor concentration are approximately the same.

As the result of extensive studies, the inventors discovered that the unevenly distributed LPDs disappear or decrease when subjected to a heat treatment. Although the detailed mechanism by which the unevenly distributed LPDs that appear as concavities and convexities on the surface disappear or decrease as the result of heat treatment is not well understood, it is thought that the release of trapped nickel or copper upon the application of heat is involved in the mechanism.

The inventors also discovered that if a wafer is cut from a silicon single crystal ingot within 50 days after ingot crystal growth is completed, even if the boron concentration and oxygen donor concentration of the ingot are within the above described specific ranges, almost no (or absolutely no) unevenly distributed LPDs arise in the wafer that is cut, and thereafter almost no unevenly distributed LPDs arise either. That is, the occurrence of the unevenly distributed LPDs is prevented or suppressed by cutting a wafer from the ingot within a predetermined period. Although the detailed mechanism of this phenomenon is not understood well, it is thought that once a wafer is cut from an ingot, Ni or copper is more liable to concentrate on the surface of the wafer than to be trapped in pin-type inversion regions, and this fact is involved in the aforementioned mechanism.

In the aforementioned Patent Literature 3, it is described that are detected on wafers in which the surface Cu concentration is $1.19 \times 10^9$ cm$^{-2}$ (atoms/cm), and wafers in which the surface Ni concentration is $2.6 \times 10^8$ cm$^{-2}$. In contrast, when the inventors measured, by Wafer Surface Analysis (WSA) method, the surface Cu concentration and surface Ni concentration of wafers on which the unevenly distributed LPDs were detected, the concentration was $1 \times 10^7$ cm$^{-2}$ or less for both the surface Cu concentration and the surface Ni concentration. Specifically, the WSA method involved analyzing a recovered liquid containing impurities using the Inductively Coupled Plasma Mass Spectrometry (ICP-MS) method.

It is difficult to identify the introduction route of nickel and copper into the wafers. There is a possibility that sources of such nickel and copper are, for example, a raw material and a quartz crucible that are used for manufacturing the silicon single crystal, as well as members used during the processes from an initial process to a final process for fabricating the wafers, for example, consumable agents such as slurry that are used in the respective processes.

The density of the LPDs in wafers observed by the inventors was low (for example, 5 to 30 LPDs per wafer with a diameter of approximately 300 mm (approximately 12 inches)), and thus when observing a single wafer it is difficult to discover that there is a characteristic in the distribution of the LPDs. However, when data for a plurality of wafers was added together, the inventors found that a characteristic exists with respect to the distribution of the LPDs on the wafers. Specifically, in wafers with a diameter of, for example, approximately 300 mm in which observed LPDs are distributed in the shape of concentric circles around the center of the wafer, there are cases where the LPD density is relatively high in a circular region within a radius of 100 mm from the center, and there are cases where the LPD density is relatively high in a ring-shaped region in a radius of 50 mm to 100 mm from the wafer center.

If semiconductor devices are manufactured using silicon wafers on which the LPDs (unevenly distributed LPDs) observed by the inventors are formed, although at the present time a problem would not arise, there is a possibility that a problem may arise in the future if the microfabrication of wiring patterns of semiconductor device progresses or the like.

The present invention was completed having obtained the above described findings, and the gist of the present invention is the methods for manufacturing a silicon wafer described in the following (A) to (F), and silicon wafers described in the following (G) and (H).

(A) A method for manufacturing a silicon wafer including, in a case where, with respect to a non-heat-treated silicon wafer, a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm$^3$ or more and $8 \times 10^{14}$ donors/cm$^3$ or less, performing a heat treatment at a temperature of 300° C. or more on the non-heat-treated silicon wafer.

(B) A method for manufacturing a silicon wafer including, in a case where, with respect to a silicon single crystal ingot or a block that is cut from the ingot, a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm$^3$ or more and $8 \times 10^{14}$ donors/cm$^3$ or less, cutting a wafer from the ingot or block within 50 days after crystal growth of the ingot is completed.

(C) A method for manufacturing a silicon wafer, including:
a step of slicing a silicon single crystal containing boron as an acceptor and obtaining a non-heat-treated silicon water;
a step of determining a boron concentration with respect to the non-heat-treated silicon wafer; and
a step of determining an oxygen donor concentration with respect to the non-heat-treated silicon wafer;
wherein, a determination as to whether or not to perform a heat treatment at a temperature of 300° C. or more on the non-heat-treated silicon wafer is made based on a boron concentration determined in the step of determining a boron concentration, and an oxygen donor concentration determined in the step of determining an oxygen donor concentration.

(D) A method for manufacturing a silicon wafer, including:
a step of determining a boron concentration with respect to a silicon single crystal ingot containing boron as an acceptor or a block that is cut from the ingot; and
a step of determining an oxygen donor concentration with respect to the ingot or block;
wherein a determination as to whether or not to cut a wafer from the ingot or block within 50 days after crystal growth of the ingot is completed is made based on a boron concentration determined in the step of determining a boron concentration and an oxygen donor concentration determined in the step of determining an oxygen donor concentration.

(E) A method for manufacturing a silicon wafer, wherein, with respect to a silicon single crystal ingot containing boron as an acceptor or to a block that is cut from the ingot, in a case where a wafer is cut from the ingot or block at a time over a period of 50 days after crystal growth of the ingot is completed that is a case which satisfies a condition that a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm$^3$ or more and $8 \times 10^{14}$ donors/cm$^3$ or less, a heat treatment at a temperature of 300° C. or more is performed on the wafer that is cut.

(F) A method for manufacturing a silicon wafer, wherein, with respect to a silicon single crystal ingot containing boron as an acceptor or to a block that is cut from the ingot, in a case where a wafer is cut from the ingot or block within 50 days after crystal growth of the ingot is completed that is a case which satisfies a condition that a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm$^3$ or more and $8 \times 10^{14}$ donors/cm$^3$ or less, a heat treatment at a temperature of 300° C. or more is not performed on the wafer that is cut.

(G) A silicon wafer that is a particle monitor wafer for monitoring particles on a semiconductor device production line,
wherein the silicon wafer is manufactured by one of the methods for manufacturing in (A) to (F) that are described above.

(H) A silicon wafer that does not include COI's and dislocation clusters,
wherein the silicon wafer is manufactured by one of the methods for manufacturing in (A) to (F) that are described above.

Herein, the term "non-heat-treated silicon wafer" refers to a wafer that has not been subjected to a heat treatment at a temperature of 300° C. or more.

Further, in this case, a time point of "completion of crystal growth" with respect to an ingot refers to a time point at which, after separating a single crystal from a melt that is used for single crystal growth, the surface temperature of the single crystal becomes room temperature (30° C.) or less.

Advantageous Effects of Invention

According to a method for manufacturing a silicon wafer of the present invention, by appropriately determining the necessity of performing a heat treatment at a temperature of 300° C. or more based on a boron concentration and an oxygen donor concentration of a non-heat-treated silicon wafer, a silicon wafer in which unevenly distributed LPDs are not present or are reduced can be obtained.

According to another method for manufacturing a silicon wafer of the present invention, by appropriately determining the necessity of cutting a wafer from a silicon single crystal ingot or a block that is cut from the ingot, within 50 days after crystal growth of the ingot is completed, based on a boron concentration and an oxygen donor concentration of the ingot or block, a silicon wafer can be obtained in which the occurrence of unevenly distributed LPDs is prevented or suppressed.

In a silicon wafer of the present invention, unevenly distributed LPDs are not present or are reduced.

DESCRIPTION OF EMBODIMENTS

Figure 1:
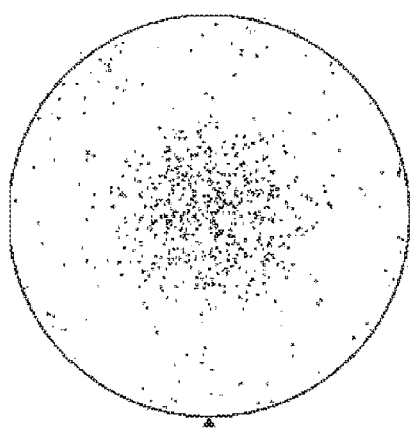
FIG. 1 is a view illustrating an example of a distribution of LPDs on a silicon wafer.
Figure 2:
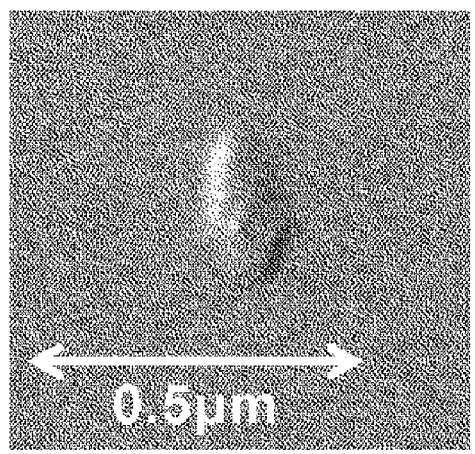
FIG. 2 is an SEM image of an LPD that has the form of a protrusion.
Figure 3:
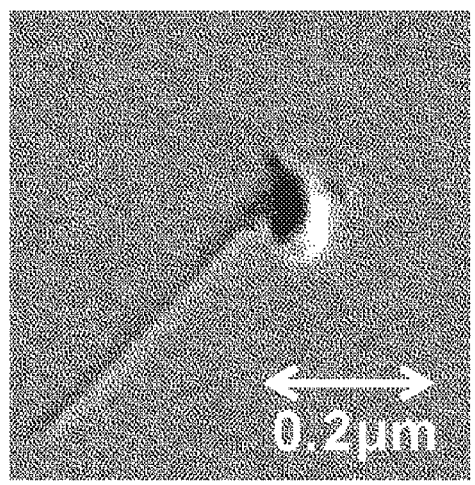
FIG. 3 is an SEM image of an LPD that has the form of a concavity.

A characteristic of a first manufacturing method of the present invention is "in a case where, with respect to a non-heat-treated silicon wafer, a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm or more and $8 \times 10^{14}$ donors/cm$^3$ or less, performing a heat treatment at a temperature of 300° C. or more on the non-heat-treated silicon wafer."

The resistivity (resistivity measured after performing donor killer heat treatment) of the silicon wafer having the boron concentration of $5 \times 10^{14}$ to $7 \times 10^{14}$ atoms/cm$^3$ is 19 to 26 Ω·cm, that is, corresponds to normal resistance. The term "donor killer heat treatment" refers to a heat treatment for eliminating oxygen donors (dioxygen complexes acting as n-type dopants), and for example, a heat treatment at 650 to 700° C. for 10 to 60 minutes can be adopted as the donor killer heat treatment.

In a range in which the boron concentration is $5 \times 10^{14}$ to $7 \times 10^{14}$ atoms/cm$^3$ and the oxygen donor concentration is $4 \times 10^{14}$ to $8 \times 10^{14}$ donors/cm$^3$, it can be said that the boron (acceptor) concentration and the donor concentration are approximately the same. In this range, unevenly distributed LPDs are liable to arise, with a contributing factor being that p/n-type inversion is liable to occur and nickel or copper is trapped in pin-type inversion regions. The unevenly distributed LPDs can be eliminated or reduced by a heat treatment at a temperature of 300° C. or more.

LPDs include LPDs which exhibit an uneven distribution (unevenly distributed LPDs) on a wafer and LPDs which do not exhibit an uneven distribution on a wafer. It is considered that the causes of these kinds of LPDs are different to each other. LPDs for which the presence/absence of the LPDs (whether the density is high or low) can be estimated based on the boron concentration and oxygen donor concentration according to the present invention are LPDs that exhibit an uneven distribution on a non-heat-treated silicon wafer.

Whether or not LPDs are "unevenly distributed LPDs" is determined as described hereunder. First, using Surfscan SP2 manufactured by KLA-Tencor Corporation as an LPD evaluation apparatus, LPDs on the surface of a wafer are observed in I-Ugh Sensitivity mode using "Dark field", "Composite", "Oblique" and "37 nm" (minimum grain size) as the settings for measurement ch/size, to thereby obtain data regarding the distribution of the LPDs. Subsequently, when the observation data for at least 25 wafers is added together, LPDs that are distributed in a circular shape or a ring shape (region between two concentric circles) on the wafers are the unevenly distributed LPDs.

However, the area of a region in which the LPDs are distributed in the circular shape or the ring shape is within a range of 10% to 70% of the total surface of the wafer. In this case, the phrase "LPDs are distributed in a circular shape or a ring shape" means that the LPD density in the relevant circular or ring-shaped region is five times or more greater than an LPD density in a region other than the circular or ring-shaped region on the wafer. In other words, when an appropriate circle or ring that is concentric with a wafer is drawn on the wafer (however, the area of the circle or ring is within a range of 10 to 70% relative to the area of the total surface of the wafer), if the LPD density inside the circle or ring is five times or more greater than an LPD density in a region other than the circle or ring, it is determined that unevenly distributed LPDs are formed on the wafer.

A boron concentration N can be determined by converting (conversion according to ASTM-17723) a resistivity $\rho$ ($\Omega \cdot cm$) of a silicon wafer measured by the four-point probe method after donor killer treatment, according to the following Formula (1).

$$N(atoms/cm^3) = (1.330 \times 10^{16})/\rho + (1.082 \times 10^{17})/\rho \times [1+(54.56 \times \rho)^{1.105}] \quad (1)$$

An oxygen donor concentration TD can be determined with respect to a silicon wafer using the relation between the resistivity of the silicon single crystal and the carrier concentration by means of the following Formula (2) or Formula (3) based on a resistivity $\rho_{BEf}$ ($\Omega \cdot cm$) before performing a donor killer heat treatment and a resistivity $\rho_{Aft}$ ($\Omega \cdot cm$) after performing the donor killer heat treatment. The following Formula (3) can be used for a pin inversion region, and the following Formula (2) can be used for a region other than a pin inversion region.

$$TD(donors/cm^3) = 1.39 \times 10^{16} \times (1/\rho_{Aft} - 1/\rho_{Bef}) \quad (2)$$

$$TD(donors/cm^3) = 1.39 \times 10^{16}/\rho_{Aft} + 5.0 \times 10^{14} \rho_{Bef} \quad (3)$$

A characteristic of a second manufacturing method of the present invention is "in a case where, with respect to a silicon single crystal ingot or a block that is cut from the ingot, a boron concentration is $5 \times 10^{14}$ atoms/cm$^3$ or more and $7 \times 10^{14}$ atoms/cm$^3$ or less and an oxygen donor concentration is $4 \times 10^{14}$ donors/cm$^3$ or more and $8 \times 10^{14}$ donors/cm$^3$ or less, cutting a wafer from the ingot or block within 50 days after crystal growth of the ingot is completed."

Measurement of a boron concentration and an oxygen donor concentration can be performed in a similar manner to measurement thereof in the first manufacturing method of the present invention. The measurement can be performed, for example, with respect to a wafer for measurement that is cut from the ingot or block, and it is not necessary to perform cutting of all production wafers en bloc together with cutting of a wafer for measurement. In order to perform cutting of production wafers within 50 days after crystal growth of the ingot is completed depending on the measurement result regarding the boron concentration and oxygen donor concentration of the ingot or block, it is necessary to perform the measurement within 50 days after crystal growth of the ingot is completed.

A characteristic of a third manufacturing method of the present invention is that the method "includes: a step of slicing a silicon single crystal containing boron as an acceptor and obtaining a non-heat-treated silicon wafer; a step of determining a boron concentration with respect to the non-heat-treated silicon wafer; and a step of determining an oxygen donor concentration with respect to the non-heat-treated silicon wafer; wherein a determination as to whether or not to perform a heat treatment at a temperature of 300° C. or more on the non-heat-treated silicon wafer is made based on a boron concentration determined in the step of determining a boron concentration, and an oxygen donor concentration determined in the step of determining an oxygen donor concentration."

Regarding the determination, in a case where a condition that the boron concentration is $5 \times 10^{14}$ atoms/cm$^3$ or more and $7 \times 10^{14}$ atoms/cm$^3$ or less and the oxygen donor concentration is $4 \times 10^{14}$ donors/cm$^3$ or more and $8 \times 10^{14}$ donors/cm$^3$ or less is not satisfied with respect to the non-heat-treated silicon wafer, the determination may be a determination to perform polishing with respect to the non-heat-treated silicon wafer without performing a heat treatment at a temperature of 300° C. or more thereon.

Regarding the determination, in a case where a condition that the boron concentration is $5 \times 10^{14}$ atoms/cm$^3$ or more and $7 \times 10^{11}$ atoms/cm$^3$ or less and the oxygen donor concentration is $4 \times 10^{14}$ donors/cm$^3$ or more and $8 \times 10^{14}$ donors/cm$^3$ or less is satisfied with respect to the non-heat-treated silicon wafer, the determination may be a determination to perform polishing after performing a heat treatment at a temperature of 300° C. or more with respect to the non-heat-treated silicon wafer.

A characteristic of a fourth manufacturing method of the present invention is that the method "includes: a step of determining a boron concentration with respect to a silicon single crystal ingot containing boron as an acceptor or a block that is cut from the ingot; and a step of determining an oxygen donor concentration with respect to the ingot or block; wherein a determination as to whether or not to cut a wafer from the ingot or block within 50 days after crystal growth of the ingot is completed is made based on a boron concentration determined in the step of determining a boron concentration and an oxygen donor concentration determined in the step of determining an oxygen donor concentration."

Regarding the determination, in a case where a condition that the boron concentration is $5 \times 10^{14}$ atoms/cm$^3$ or more and $7 \times 10^{14}$ atoms/cm$^3$ or less and the oxygen donor concentration is $4\times10^{14}$ donors/cm$^3$ or more and $8\times10^{14}$ donors/cm$^3$ or less is satisfied with respect to the ingot or block, the determination may be a determination to cut a wafer from the ingot or block within 50 days after crystal growth of the ingot is completed.

In the first and third manufacturing methods of the present invention, it is not necessary to perform measurement of the boron concentration and the oxygen donor concentration with respect to the non-heat-treated silicon wafer within 50 days after crystal growth of the ingot is completed. If the measurement is performed within 50 days after crystal growth of the ingot is completed, it is expected that unevenly distributed LPDs will not be formed on the non-heat-treated silicon wafer at that time point. However, in the case of such a non-heat-treated silicon wafer in which the boron concentration is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, there is the possibility that unevenly distributed LPDs will arise with the passage of time. With regard to such a wafer, the occurrence of unevenly distributed LPDs can be prevented or suppressed by performing a heat treatment at a temperature of 300° C. or more on the wafer.

In fifth and sixth manufacturing methods of the present invention, a heat treatment at a temperature of 300° C. or more is performed or is not performed depending on the boron concentration and oxygen donor concentration of the ingot or block as well as the timing at which a wafer is cut from the ingot or block.

A characteristic of the fifth manufacturing method of the present invention is that "with respect to a silicon single crystal ingot containing boron as an acceptor or to a block that is cut from the ingot, in a case where a wafer is cut from the ingot or block at a time over a period of 50 days after crystal growth of the ingot is completed that is a case which satisfies a condition that the boron concentration is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, a heat treatment at a temperature of 300° C. or more is performed on the wafer that is cut."

With respect to an ingot or a block satisfying a condition that the boron concentration thereof is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, there is a possibility that unevenly distributed LPDs will be formed in a wafer that is cut from the ingot or block at a time over a period of 50 days after crystal growth of the ingot is completed. By performing a heat treatment at a temperature of 300° C. or more on such a wafer, unevenly distributed LPDs that are already formed can be eliminated or reduced.

A characteristic of the sixth manufacturing method of the present invention is that "with respect to a silicon single crystal ingot containing boron as an acceptor or to a block that is cut from the ingot, in a case where a wafer is cut from the ingot or block within 50 days after crystal growth of the ingot is completed that is a case which satisfies a condition that the boron concentration is $5\times10^{31}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, a heat treatment at a temperature of 300° C. or more is not performed on the wafer that is cut."

With respect to an ingot or a block satisfying a condition that the boron concentration thereof is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, the possibility that unevenly distributed LPDs will not be formed in a wafer that is cut from the ingot or block within 50 days after crystal growth of the ingot is completed is extremely high and the possibility of unevenly distributed LPDs being formed thereafter is also extremely low. Therefore, in this case, even if a heat treatment at a temperature of 300° C. or more is not performed on the wafer that is cut, in most cases a silicon wafer can be obtained in which there are substantially no unevenly distributed LPDs. Further, by not performing a heat treatment, the time and cost required to manufacture the silicon wafer can be reduced.

A characteristic of a silicon wafer of the present invention is that the silicon wafer is "a particle monitor wafer for monitoring particles on a semiconductor device production line, wherein the silicon wafer is manufactured by any one of the above described manufacturing methods."

A particle monitor wafer is a so-called "dummy wafer", and is introduced onto a semiconductor device production line separately from production wafers. Particles are detected by a surface inspection apparatus that inspects the surface of a wafer. However, a surface inspection apparatus also detects crystal defects on the wafer surface. The detected crystal defects cannot necessarily be distinguished from particles. In the silicon wafer of the present invention, because the number of LPDs is remarkably reduced, using the silicon wafer as a particle monitor wafer makes it possible to exactly evaluate the number (density) of particles present on the wafer surface when an inspection is performed by a surface inspection apparatus.

A characteristic of another silicon wafer of the present invention is that "the silicon wafer does not include COI's and dislocation clusters, wherein the silicon wafer is manufactured by any one of the above described manufacturing methods."

Crystal originated particles (COPs) are aggregates of vacancies (micro voids) that are devoid of atoms that make up a crystal lattice during single crystal growth, and dislocation clusters are aggregates of interstitial silicon excessively incorporated between lattices. During semiconductor device manufacture, if COI's that are present in the vicinity of the wafer surface are incorporated into an oxide film during thermal oxidation of the wafer surface, the Gate Oxide Integrity (GOI) characteristics of the semiconductor device are degraded, and the dislocation clusters also become a cause of faulty device characteristics. Thus, both COPs and dislocation clusters adversely affect device characteristics.

By manufacturing a semiconductor device from a silicon wafer formed of a detect-free region that does not include COPs and dislocation clusters, the occurrence of the above described degradation in characteristics or faulty characteristics can be avoided. A silicon wafer that does not include COPs and dislocation clusters can be obtained by cutting the wafer from a silicon single crystal ingot that does not include COPs and dislocation clusters. In the case of manufacturing a silicon single crystal by the Czochralski method, a silicon single crystal that does not include COPs and dislocation clusters can be manufactured by appropriately controlling a ratio V/G of a pulling rate V of the silicon single crystal to a temperature gradient G in a growth direction inside the single crystal immediately after pulling (for example, see the above described Patent Literature 4).

A method for manufacturing a silicon wafer according to a first embodiment of the present invention will now be described. First, a silicon single crystal is grown by the CZ method. At this time, the silicon single crystal is doped with boron as an acceptor. Next, an obtained silicon single crystal ingot is sliced to obtain a non-heat-treated silicon wafer. Subsequently, lapping, chamfering, grinding and etching are sequentially performed on the non-heat-treated silicon wafer.

Next, the boron concentration and oxygen donor concentration of the obtained non-heat-treated silicon wafer are determined. When cutting the wafer from the silicon single crystal ingot, first, the silicon single crystal may be cut so as to be divided into several blocks in the axial direction, and a wafer may be cut from the respective blocks. Non-heat-treated silicon production wafers may be cut from the silicon single crystal ingot separately from the non-heat-treated silicon wafer (sample for evaluation) for measuring the boron concentration and the oxygen donor concentration, for example, after the boron concentration and oxygen donor concentration are determined. The boron concentration and oxygen donor concentration of the respective wafers (non-heat-treated silicon wafers) can be determined based on the above described Formulae (1) to (3).

Using the determined boron concentration and oxygen donor concentration, a determination is made regarding whether or not to perform a heat treatment on the non-heat-treated silicon wafer based on whether or not the boron concentration of the silicon wafer is from $5 \times 10^{14}$ to $7 \times 10^{14}$ atoms/cm$^3$ and the oxygen donor concentration is from $4 \times 10^{14}$ to $8 \times 10^{14}$ donors/cm$^3$. Note that, with respect to a portion (region) at which to measure the boron concentration and oxygen donor concentration on the non-heat-treated silicon wafer, the measurement may be performed at multiple points on the surface of the wafer or may be performed at only a single center point. In either case, it is possible to determine whether or not to perform a heat treatment.

A determination as to whether or not to perform a heat treatment may also be made in lot units. Silicon wafers that are cut from the same block are taken as belonging to the same lot. If a block is long, silicon wafers obtained after subdividing the block may be defined as a lot. When making a determination in lot units, a boron concentration and an oxygen donor concentration can be determined based on the above described Formulae (1) to (3) from a non-heat-treated silicon wafer of one part of the lot or a sample for evaluation that is extracted from one part of the block that is the source of the lot, and the boron concentration and oxygen donor concentration that are determined can be taken as the boron concentration and oxygen donor concentration for the entire lot.

The heat treatment can be performed for 1 to 3600 seconds at a temperature that is 300° C. or more and 800° C. or less. The time period of this heat treatment is extremely short in comparison to the time period of the heat treatment required by the method described in Patent Literature 3. The heat treatment of the present invention may be performed, for example, by performing lamp annealing that is suitable for the short-time heat treatment. A heat treatment performed, for example, at a temperature of 650 to 800° C. for one second or more can also be adopted as the heat treatment. It is also possible to perform a heat treatment for another purpose, such as for donor killing, as the heat treatment (heat treatment for eliminating or reducing unevenly distributed LPDs) of the present invention.

There is a high possibility that unevenly distributed LPDs will be present in a wafer whose boron concentration is from $5 \times 10^{14}$ to $7 \times 10^{14}$ atoms/cm$^3$ and whose oxygen donor concentration is from $4 \times 10^{14}$ to $8 \times 10^{14}$ donors/cm$^3$. If unevenly distributed LPDs are present, the unevenly distributed LPDs are eliminated or reduced by the heat treatment. After the heat treatment, polishing of the silicon wafer is performed. The polishing is performed irrespective of whether or not the non-heat-treated silicon wafer includes unevenly distributed LPDs (that is, the polishing is not a special process that is performed based on the relation with unevenly distributed LPDs), and is polishing that is normally performed when manufacturing silicon wafers for semiconductors.

It is desirable that the heat treatment according to the present invention is performed before the polishing process, and even in a case of performing polishing again for some reason after the polishing process has been performed once, it is desirable to perform the heat treatment before the (initial) polishing process.

In a case where there is one or a plurality of the non-heat-treated silicon wafers or the samples for evaluation satisfying the condition that the boron concentration is $5 \times 10^{14}$ to $7 \times 10^{14}$ atoms/cm$^3$ and the oxygen donor concentration is $4 \times 10^{14}$ to $8 \times 10^{14}$ donors/cm$^3$, the heat treatment may be performed in a lot unit with respect to the lot in which the non-heat-treated silicon wafers or samples for evaluation are included.

On the other hand, in a case where it is not determined with respect to a silicon wafer that the boron concentration is $5 \times 10^{14}$ to $7 \times 10^{14}$ atoms/cm$^3$ and the oxygen donor concentration is $4 \times 10^{14}$ to $8 \times 10^{14}$ donors/cm$^3$ based on the boron concentration and oxygen donor concentration that are determined, the possibility that unevenly distributed I-PDs are not formed in the silicon wafer is high. In this case, the polishing is performed on the silicon wafer without performing the heat treatment. A case in which the polishing is performed without performing the heat treatment may also be a case which, for example, simultaneously satisfies the following conditions A and B.

A: It is determined that the boron concentration is from $5 \times 10^{14}$ to $10 \times 10^{14}$ atoms/cm$^3$ and the oxygen donor concentration is from $1 \times 10^{14}$ to $10 \times 10^{14}$ donors/cm$^3$.

B: It is not determined that the boron concentration is from $5 \times 10^{14}$ to $7 \times 10^{14}$ atoms/cm$^3$ and the oxygen donor concentration is from $4 \times 10^{14}$ to $8 \times 10^{14}$ donors/cm$^3$.

In a case of adopting the boron concentration and oxygen donor concentration of a non-heat-treated silicon wafer or a sample for evaluation as the boron concentration and oxygen donor concentration of a lot in which the non-heat-treated silicon wafer or the sample for evaluation is included, when a condition that the boron concentration is from $5 \times 10^{14}$ to $7 \times 10^{14}$ atoms/cm$^3$ and the oxygen donor concentration is from $4 \times 10^{14}$ to $8 \times 10$ donors/cm$^3$ is not satisfied, polishing may be performed on all the silicon wafers of the relevant lot without performing the heat treatment.

In either case, after polishing, the silicon wafer is washed and a product as a polished wafer is obtained.

Next, a method for manufacturing a silicon wafer according to a second embodiment of the present invention will be described. First, growth of a silicon single crystal ingot is performed in the same manner as in the manufacturing method of the first embodiment. Next, at least a wafer for measuring a boron concentration and oxygen donor concentration is cut from the ingot. The ingot may also be cut into a block, and a water for measurement and a production water may be cut from the block.

The boron concentration and oxygen donor concentration of the wafer are then measured within 50 days after crystal growth is completed. If it is determined as a result the boron concentration is $5 \times 10^{14}$ atoms/cm$^3$ or more and $7 \times 10^{14}$ atoms/cm$^3$ or less and the oxygen donor concentration is $4 \times 10^4$ donors/cm$^3$ or more and $8 \times 10^{14}$ donors/cm$^3$ or less, production wafers are cut from the ingot within 50 days after crystal growth of the ingot has been completed. By this means, occurrence of unevenly distributed LPDs after the wafers are cut can be prevented or suppressed. The thickness of the cut wafers can be made, for example, a thickness of 0.8 to 1.5 mm with respect to a wafer with a diameter of approximately 300 mm.

In contrast, if it is not determined that the boron concentration is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less, a time period in which to cut wafers from the ingot is not particularly limited. That is, in this case, even if the ingot is stored as it is, since the possibility of unevenly distributed LPDs arising over the passage of time is extremely low, production wafers may be cut from the ingot within 50 days after crystal growth of the ingot is completed or may be cut from the ingot after 50 days or more have passed since crystal growth of the ingot is completed.

After cutting the wafers, the processes from polishing onwards are performed in the same manner as in the first embodiment of the present invention.

EXAMPLES

Example 1

A boron concentration and an oxygen donor concentration at a single center point of the wafers were determined with respect to non-heat-treated silicon wafers in which unevenly distributed LPDs were observed and non-heat-treated silicon wafers in which unevenly distributed LPDs were not observed. None of these non-heat-treated silicon wafers included COPs or dislocation clusters. The boron concentration was determined by the above described method using the aforementioned Formula (1). The oxygen donor concentration was determined by the above described method using the aforementioned Formula (2) or Formula (3). Further, whether or not unevenly distributed LPDs were present on the respective wafers was determined by the aforementioned method with respect to the distribution of LPDs by adding together the data for 25 wafers. In regions on the aforementioned non-heat-treated silicon wafers on which the unevenly distributed LPDs were observed, the LPD density was a high value equivalent 5 to 14 times the LPD density in other regions.

Figure 4:
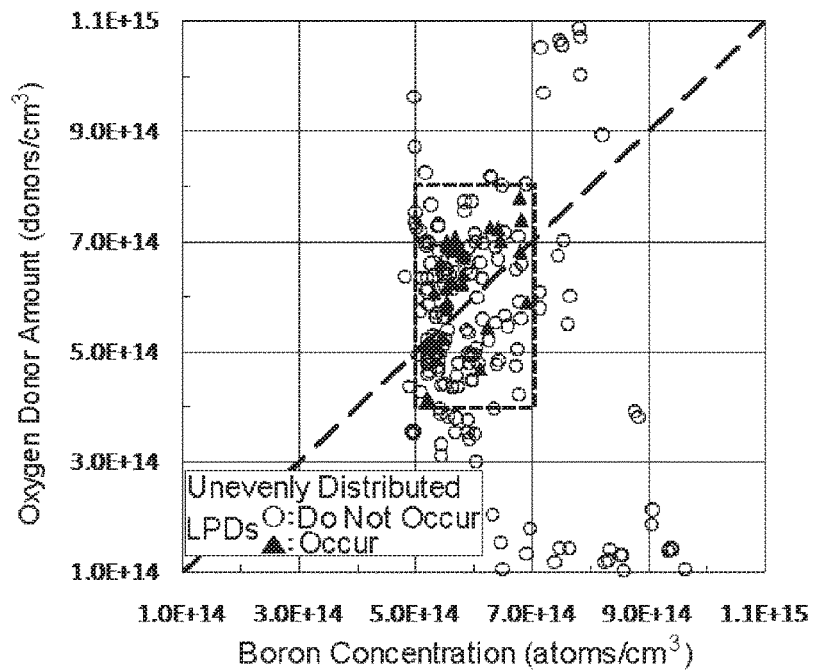
FIG. 4 is a graph illustrating a relation between a boron concentration, an oxygen donor concentration and whether or not LPDs occur.

FIG. 4 is a graph in which the above results are summarized, and shows the relation between the boron concentration, the oxygen donor concentration and whether or not unevenly distributed LPDs occur. Based on FIG. 4 it is found that in most of the non-heat-treated silicon wafers on which unevenly distributed LPDs were observed, the boron concentration is within a range of $5\times10^{14}$ to $7\times10^{14}$ atoms/cm$^3$ and the oxygen donor concentration is in a range of $4\times10^{14}$ to $8\times10^{14}$ donors/cm$^3$.

By subjecting such non-heat-treated silicon wafers to a heat treatment at 650° C. for 3 seconds to 30 minutes, the density of the unevenly distributed LPDs observed on the wafer surface could be significantly reduced. As a result of the heat treatment, although the density of LPDs that were in the unevenly distributed LPDs region became a fraction of the original density thereof, the LPD density outside the unevenly distributed LPDs region was almost unchanged. As a result, a large difference between the unevenly distributed LPDs region and the region outside the unevenly distributed LPDs region disappeared, and the ratio of the LPD density in the unevenly distributed LPDs region to the LPD density in the region other than the unevenly distributed LPDs region was less than 5 after the heat treatment.

Thus, it was confirmed that unevenly distributed LPDs can be eliminated or reduced by the present invention. However, non-heat-treated silicon wafers in which unevenly distributed LPDs were not observed are also present in the aforementioned range of the boron concentration and oxygen donor concentration. However, time and labor required to check for the presence of unevenly distributed LPDs in each individual wafer can be eliminated by uniformly subjecting the non-heat-treated silicon wafers within this range to the heat treatment.

Further, in this test, unevenly distributed LPDs were not observed in non-heat-treated silicon wafers for which the boron concentration was less than $5\times10^{11}$ atoms/cm or over $7\times10^{14}$ atoms/cm$^3$, or for which the oxygen donor concentration was less than $4\times10^{14}$ donors/cm$^3$ or over $8\times10^{14}$ donors/cm$^3$.

Example 2

The Czochralski method was used to grow 420 silicon single crystal ingots, the number of days (hereunder, referred to as "lead time") until cutting wafers from the ingots after crystal growth completion was changed, and the boron concentration and oxygen donor concentration of the cut wafers were measured, and the presence/absence of unevenly distributed LPDs on the cut wafers was also examined.

Figure 5:
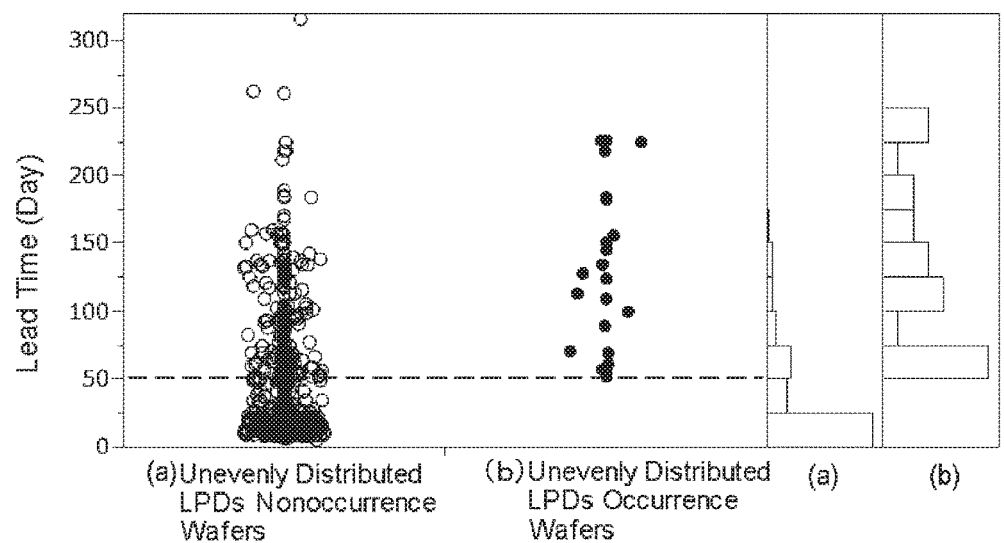
FIG. 5 is a graph illustrating a relation between types of ingots and the number of days until cutting wafers after crystal growth completion.

FIG. 5 is a graph illustrating the lead time for each type of wafer. A portion on the right side of FIG. 5 shows histograms for the lead times.

Regarding the types of wafers, the wafers described as "(a) Unevenly Distributed LPDs Nonoccurrence Wafers" (hereunder, referred to as "type (a)") are wafers in which unevenly distributed LPDs did not occur. The type (a) wafers include wafers satisfying the condition that the boron concentration is $5\times10^{14}$ atoms/cm$^3$ or more and $7\times10^{14}$ donors/cm$^3$ or less and the oxygen donor concentration is $4\times10^{14}$ donors/cm$^3$ or more and $8\times10^{14}$ donors/cm$^3$ or less, and also include wafers that do not satisfy the aforementioned condition. Among the type (a) wafers, wafers for which the lead time over 50 days were all wafers that did not satisfy the condition that the boron concentration is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less.

The wafers described as "(b) Unevenly Distributed LPDs Occurrence Wafers" (hereunder, referred to as "type (b)") are wafers in which unevenly distributed LPDs occurred, and all of these wafers satisfied the condition that the boron concentration is $5\times10^{14}$ atoms/cm$^3$ or more and $7\times10^{14}$ atoms/cm$^3$ or less and the oxygen donor concentration is $4\times10^{14}$ donors/cm$^3$ or more and $8\times10^{14}$ donors/cm$^3$ or less.

The average lead time for the type (a) wafers was 39.8074 days, while the average lead time for the type (b) wafers was 60.2720 days. A t-test was performed, and it was found that the difference between the average lead time of the type (a) wafers and the average lead time of the type (a) wafers was significant, with the level of significance being 5%.

Based on FIG. 5 it is found that all of the wafers in which unevenly distributed LPDs occurred were wafers that were cut from an ingot after 50 days or more had passed after the completion of crystal growth. Based on this result, it was found that the occurrence of unevenly distributed LPDs can be prevented by cutting wafers from an ingot within 50 days after the completion of crystal growth.

The invention claimed is:

1. A method for manufacturing a silicon wafer, comprising,
   growing a silicon single crystal ingot having boron as an acceptor;
   cutting the silicon single crystal ingot to form a non-heat-treated silicon wafer;
   selecting the non-heat-treated silicon wafer having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less; and
   performing a heat treatment at a temperature of 300° C. or more on the non-heat-treated silicon wafer such that the oxygen donor concentration is reduced to less than $4\times10^{14}$ donors/cm$^3$,
   the non-heat-treated silicon wafer being a wafer that has not been subjected to a heat treatment at a temperature of 300° C. or more.

2. A method for manufacturing a silicon wafer, comprising,
   growing a silicon single crystal ingot having boron as an acceptor;
   selecting the silicon single crystal ingot within 50 days after crystal growth of the ingot is completed, the ingot having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less;
   cutting a wafer from the selected silicon single crystal ingot within 50 days after crystal growth of the ingot is completed; and
   polishing the wafer.

3. The method for manufacturing a silicon wafer according to claim 1, wherein
   the heat treatment is performed as a donor killer heat treatment, and
   a resistivity after the heat treatment is 19 Ω·cm or more and 26 Ω·cm or less, the donor killer heat treatment being performed at 650 to 700° C.

4. A method for manufacturing a silicon wafer, comprising,
   providing a silicon single crystal ingot containing boron as an acceptor;
   slicing the silicon single crystal ingot and thereby obtaining a non-heat-treated silicon wafer that is a wafer that has not been subjected to a heat treatment at a temperature of 300° C. or more;
   measuring a boron concentration with respect to the non-heat-treated silicon wafer;
   measuring an oxygen donor concentration with respect to the non-heat-treated silicon wafer;
   selecting the non-heat-treated silicon wafer that has
      the measured boron concentration of $5\times10^{14}$ atoms/cm$^3$ or more and $7\times10^{14}$ atoms/cm$^3$ or less, and
      the measured oxygen donor concentration of $4\times10^{14}$ donors/cm$^3$ or more and $8\times10^{14}$ donors/cm$^3$ or less, and
   performing a heat treatment at a temperature of 300° C. or more on the selected non-heat-treated silicon wafer such that the oxygen donor concentration is reduced to less than $4\times10^{14}$ donors/cm$^3$.

5. A method for manufacturing a silicon wafer, comprising:
   growing a silicon single crystal ingot containing boron as an acceptor;
   slicing the silicon single crystal ingot and thereby obtaining a non-heat-treated silicon wafer that is a wafer that has not been subjected to a heat treatment at a temperature of 300° C. or more;
   measuring a boron concentration with respect to the non-heat-treated silicon wafer;
   measuring an oxygen donor concentration with respect to the non-heat-treated silicon wafer;
   selecting the non-heat-treated silicon wafer
      that has a measured boron concentration of $5\times10^{14}$ atoms/cm$^3$ or more and $10\times10^{14}$ atoms/cm$^3$ or less and a measured oxygen donor concentration of $1\times10^{14}$ donors/cm$^3$ or more and $11\times10^{14}$ donors/cm$^3$ or less, and
      that does not have a measured boron concentration of $5\times10^{14}$ atoms/cm$^3$ or more and $7\times10^{14}$ atoms/cm$^3$ or less and a measured oxygen donor concentration of $4\times10^{14}$ donors/cm$^3$ or more and $8\times10^{14}$ donors/cm$^3$ or less, and
   polishing the non-heat-treated silicon wafer without performing a heat treatment at a temperature of 300° C. or more thereon.

6. The method for manufacturing a silicon wafer according to claim 4, wherein the heat treatment is performed at a temperature of 300° C. or more on the non-heat-treated silicon wafer in lot units.

7. A method for manufacturing a silicon wafer, comprising:
   growing a silicon single crystal ingot having boron as an acceptor;
   optionally, cutting a block from the ingot;
   measuring a boron concentration with respect to
      the silicon single crystal ingot or
      the block;
   measuring an oxygen donor concentration with respect to the ingot or block;
   selecting the ingot or block that has a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less, and
   cutting a wafer from the ingot or block within 50 days after crystal growth of the ingot is completed.

8. The method for manufacturing a silicon wafer according to claim 7, wherein the wafer is cut from the ingot or block in lot units within 50 days after crystal growth of the ingot is completed.

9. A method for manufacturing a silicon wafer, comprising,
   growing a silicon single crystal ingot containing boron as an acceptor;
   optionally, cutting a block from the ingot;
   cutting a wafer from the ingot or block at a time over a period of 50 days after crystal growth of the ingot is completed, the ingot or block having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less; and
   performing a heat treatment at a temperature of 300° C. or more on the wafer that is cut such that the oxygen donor concentration is reduced to less than $4\times10^{14}$ donors/cm$^3$.

10. A method for manufacturing a silicon wafer, comprising,
    growing a silicon single crystal ingot containing boron as an acceptor;
    optionally, cutting a block from the ingot;

selecting the ingot or block having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less;

cutting a wafer from the ingot or block within 50 days after crystal growth of the ingot is completed, the ingot or block having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less; and avoiding a heat treatment at a temperature of 300° C. or more on the wafer; and polishing the wafer.

11. The method for manufacturing a silicon wafer according to claim 2, further comprising performing a donor killer heat treatment on the wafer, wherein a resistivity after the donor killer heat treatment is performed is 19 Ω·cm or more and 26 Ω·cm or less, the donor killer heat treatment being performed at 650 to 700° C.

12. A method for manufacturing a silicon wafer, comprising, growing a silicon single crystal ingot having boron as an acceptor;

cutting a block from the silicon single crystal ingot;

cutting the block to form a non-heat-treated silicon wafer;

selecting the non-heat-treated silicon wafer having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less; and performing a heat treatment at a temperature of 300° C. or more on the non-heat-treated silicon wafer such that the oxygen donor concentration is reduced to less than $4\times10^{14}$ donors/cm$^3$, the non-heat-treated silicon wafer being a wafer that has not been subjected to a heat treatment at a temperature of 300° C. or more.

13. A method for manufacturing a silicon wafer, comprising, growing a silicon single crystal ingot having boron as an acceptor;

cutting a block from the silicon single crystal ingot;

selecting the block within 50 days after crystal growth of the ingot is completed, the block having a boron concentration of $5\times10^{14}$ atoms/cm$^3$ or more and $7\times10^{14}$ atoms/cm$^3$ or less and an oxygen donor concentration of $4\times10^{14}$ donors/cm$^3$ or more and $8\times10^{14}$ donors/cm$^3$ or less;

cutting a wafer from the selected block within 50 days after crystal growth of the ingot is completed; and polishing the wafer.

14. The method for manufacturing a silicon wafer according to claim 1, further comprising performing a donor killer heat treatment on the wafer after performing the heat treatment, wherein a resistivity after the donor killer heat treatment is 19 Ω·cm or more and 26 Ω·cm or less, the donor killer heat treatment being performed at 650 to 700° C.

\* \* \* \* \*